United States Patent [19]

Burton et al.

[11] Patent Number: 5,467,027
[45] Date of Patent: Nov. 14, 1995

[54] PROGRAMMABLE CELL WITH A PROGRAMMABLE COMPONENT OUTSIDE THE SIGNAL PATH

[75] Inventors: Edward A. Burton, Lindon; Jeffrey A. West, Pleasant Grove, both of Utah

[73] Assignee: North American Philips Corporation, New York, N.Y.

[21] Appl. No.: 191,557

[22] Filed: Jan. 25, 1993

Related U.S. Application Data

[63] Continuation of Ser. No. 709,241, Jun. 3, 1991, abandoned.

[51] Int. Cl.$^6$ .................................................. H03K 19/693
[52] U.S. Cl. .................................. 326/38; 326/42; 326/44
[58] Field of Search .................................. 307/465–469, 307/202.1; 365/225.7, 96, 201; 326/38, 44

[56] References Cited

U.S. PATENT DOCUMENTS

| | | | |
|---|---|---|---|
| 4,612,459 | 9/1986 | Pollacheck | 307/468 |
| 4,651,030 | 3/1987 | Mimato | 307/468 |
| 4,789,966 | 12/1988 | Ozaki | 365/96 |
| 4,814,646 | 3/1989 | Hoberman et al. | 307/467 |
| 4,872,137 | 10/1989 | Jennings, III | 364/900 |
| 4,896,055 | 1/1990 | Fujii et al. | 307/468 |
| 4,959,564 | 9/1990 | Steele | 307/468 |
| 5,099,149 | 3/1992 | Smith | 307/202.1 |

*Primary Examiner*—David R. Hudspeth
*Assistant Examiner*—Andrew Sanders
*Attorney, Agent, or Firm*—Steven R. Biren

[57] ABSTRACT

An electronic circuit comprises a programmable cell that comprises a cell input, an output, a programmable component, programming means for selectively changing a state of the component, and coupling means for providing a signal path from the cell input to the output dependent on the component's state. The programmable component, e.g., a fuse, is located outside the signal path. Capacitances that limit the speed of operation in the read mode are considerably lower than in the prior art.

22 Claims, 2 Drawing Sheets

PROGRAMMABLE CELL WITH A PROGRAMMABLE COMPONENT OUTSIDE THE SIGNAL PATH

This is a continuation of application Ser. No. 07/709,241, filed Jun. 3, 1991, now abandoned.

FIELD OF THE INVENTION

The invention relates to an electronic circuit comprising a programmable cell with, between a cell input and an output, a connection that is programmable through a programmable component. The invention also relates to a plurality of such cells, preferably fabricated in monolithic integrated circuit form.

BACKGROUND ART

Programmable cells of the above type are widely used in integrated circuits, such as programmable read only memories and programmable logic devices.

The programmable component may comprise, for instance, an electrically programmable fuse or anti-fuse. The component is programmed by modifying its physical or chemical character, for instance, by means of a high current. The heat that is generated by the current in the component causes, for instance, deformation of a conductive signal path through melting or the inclusion or formation of substances that change the path's originally conductive or isolating state.

In the known cell the programmable connection typically consists of a transistor having its control electrode coupled to the cell input and having its main current path placed between a supply voltage terminal and the output in series with the component. Consequently, the component is located in the signal path between the cell input and the output. Examples of such cells are shown in U.S. Pat. No. 4,814,646, FIG. 3c.

Such a series arrangement of the transistor and the programmable component requires the transistor to be quite large in order to provide a sufficiently high current to alter the component during programming of the cell. A bipolar transistor that is connected to the component typically has an emitter area of 2×10 um², which is quite large. However, accessing the cell, i.e., supplying an input signal and detecting the associated output signal, does not require such a large transistor. In addition to the large area, the attendant large parasitic capacitance is another disadvantage since it limits charging and discharging speeds at the various transistor nodes.

OBJECTS OF THE INVENTION

Therefore, it is an object of this invention to provide a programmable cell of the above kind wherein smaller devices, for instance, smaller transistors, are present. It is a further object to provide such cell with smaller parasitic capacitances. It is another object to provide an integrated circuit with an array of such cells that operates faster than prior art arrays. It is still another object of the invention to implement such a cell and such an array as part of an integrated circuit fabricated in a BiCMOS technology.

SUMMARY OF THE INVENTION

For this purpose, the invention provides an electronic circuit comprising a programmable cell with, between a cell input and an output, a connection that is programmable through a programmable component. The component is located outside the connection.

The connection between the cell input and output now is made smaller since the programming current is routed through the cell along a programming path outside the connection. As a consequence, the parasitic capacitances associated with the programmable connection itself are reduced considerably, and the operation speed with regard to reading the cell's contents is greatly increased.

BRIEF DESCRIPTION OF THE DRAWING

The invention will be explained by way of example and with reference to the accompanying drawing in which.

Throughout the figures, the same reference numerals are used to indicate identical or corresponding features.

DETAILED DESCRIPTION OF THE EMBODIMENTS

PRINCIPAL SCHEME

Figure 1:
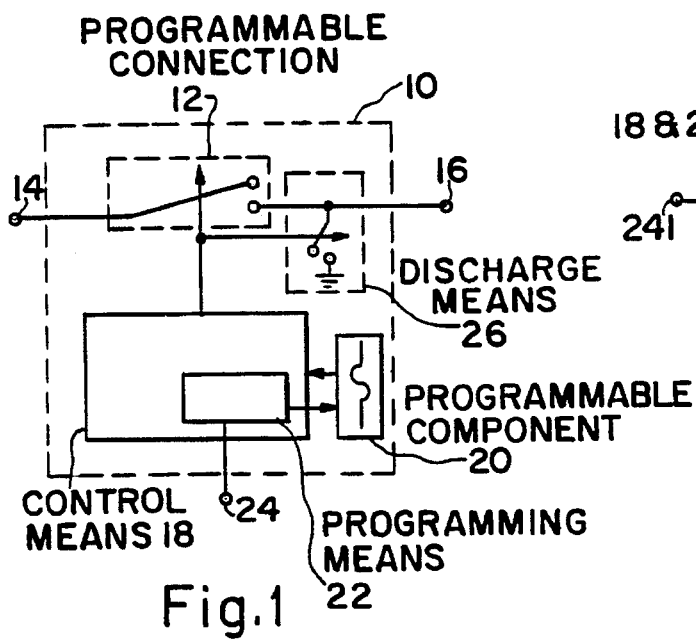
FIG. 1 shows the principle of the invention.

FIG. 1 schematically shows the principle of a programmable cell 10 in accord with the invention. Cell 10 includes a programmable connection 12 for connecting a cell input 14 to an output 16. A control circuit 18 controls connection 12 under control of the state of a programmable component 20. Programmable component 20 includes, for instance, a fuse, an anti-fuse, a transistor with a programmable threshold voltage (for instance, a floating-gate transistor or an MNOS transistor) or another device, the programming of which entails high voltages or high currents. A programming circuit 22 modifies the state of component 20 in response to a programming signal at a control input 24, for instance, by means of routing a high current through component 20. A discharge means 26 is included for under control of control means 18 discharging output 16 by means of connecting output 16 to ground.

The programming path for component 20 and the connection between cell input 14 and output 16 are completely separated. Consequently, connection 12 is not subjected to the programming conditions, such as high voltage or high current, and therefore can be implemented to only operate under milder conditions. This results in a smaller size of connection 12, giving rise to faster operation when reading the cell, owing to smaller parasitic effects such as capacitances.

FIRST EXAMPLE

Figure 2:
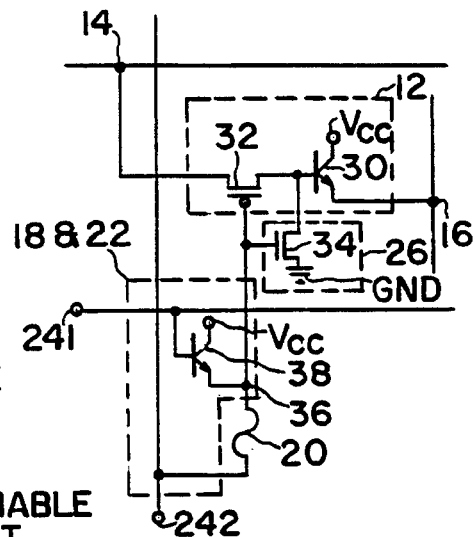
FIGS. 2–6 are various embodiments of a programmable cell in accordance with the invention.

FIG. 2 shows a first example for implementing the concept of FIG. 1. Connection 12 comprises an npn bipolar transistor 30 with a main current path arranged between a power supply node $V_{cc}$ and output 16. Connection 12 further comprises a p-channel field effect transmission transistor (PFET) 32 that couples cell input 14 to a control electrode of transistor 30. Discharge means 26 includes an n-channel field effect discharge transistor (NFET) 34 whose main current path is connected between the control electrode of transistor 30 and ground. PFET 32 and NFET 34 have their respective control electrodes connected to one another and to programmable component 20 via a node 36. Programmable component 20 in this example contains a fuse, likewise indicated by reference numeral 20.

Control means 18 comprises an npn bipolar transistor 38. Transistor 38 has a main current path connected between power supply node $V_{cc}$ and node 36, and has a control electrode connected to a first control input 241. A second control input 242 is connected to fuse 20.

Operation in the read mode is as follows. Assume that fuse 20 is intact, i.e., electrically conductive. A high voltage (e.g., $V_{cc}$) at control input 241 and a low voltage (e.g., GND) at second control input 242 turns on transistor 38. The series arrangement of transistor 38 and fuse 20 acts as a sensor for sensing the state of fuse 20. Transistor 38 is a current source that charges node 36 if fuse 20 is blown. Since fuse 20 is conductive, PFET 32 and NFET 34 receive a low voltage at their respective control electrodes. Consequently, PFET 32 is turned on and connects cell input 14 to the control electrode of transistor 30, whereas NFET 34 is turned off.

Fuse 20 is blown in the program mode as follows. A sufficiently high program voltage (e.g., higher than $V_{cc}$) applied to first control input 241 and a low voltage at second control input 242 causes transistor 38 to conduct a high programming current through fuse 20. Fuse 20 is destroyed when the resultant heat melts the fuse's material. Once fuse 20 is blown, a high voltage at first control input 241 causes a high voltage at node 36. This turns on NFET 34 and turns off PFET 32. NFET 34 then disables transistor 30 by forming a discharge path for the control electrode of transistor 30. PFET 32 interrupts the signal path between cell input 14 and output 16. As a result, the signal at cell input 14 does not propagate to output 16.

SECOND EXAMPLE

Figure 3:
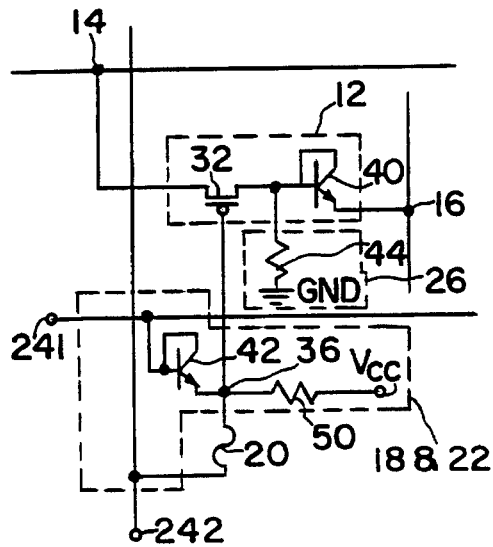

FIG. 3 shows a second example of a cell in the invention. With regard to FIG. 2, a resistor 50 is added that couples node 36 to voltage supply $V_{cc}$. Now, control inputs 241 and 242 may stay grounded in the read mode. Resistor 50 acts as a current supply for keeping node 36 at $V_{cc}$ in case fuse 20 has been blown. In case fuse 20 is conductive, the current supplied by resistor 50 flows towards GND via fuse 20 and node 36 is kept grounded. Typically, resistor 50 represents a 10 uA load.

In this example, transistors 30 and 38 in FIG. 2 are replaced by diodes 40 and 42, respectively. Also a discharge resistor 44 is substituted for discharge transistor 34 in FIG. 2. Operation of the cell further is substantially the same as in FIG. 2.

THIRD EXAMPLE

Figure 4:
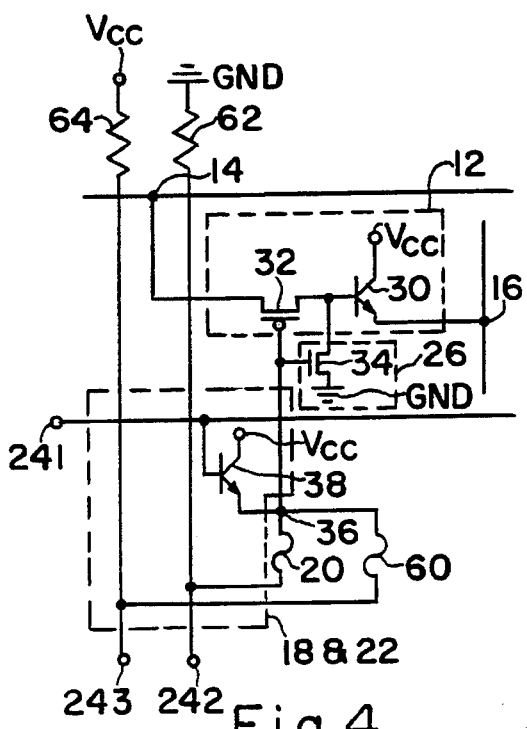

FIG. 4 shows a third example of a cell in the invention. The cell now contains first fuse 20, arranged between node 36 and second control input 242, and a second fuse 60, located between node 36 and a third control input 243. One of the fuses 20 and 60 has to be blown for operation of the cell. This is done, for instance, as follows. Transistor 38 supplies a programming current when first control input 241 is at a high voltage and either second or third control input 242 or 243 is kept at a low voltage. If second control input 242 is kept low and third control input 243 is kept high or floating, fuse 20 will be blown. If third control input 243 is kept low whereas second control input 242 is kept high or floating, fuse 60 will be blown.

In the read mode, second and third control inputs 242 and 243 are coupled to GND and $V_{cc}$, respectively, through resistors 62 and 64. If fuse 20 was blown, node 36 carries a high voltage $V_{cc}$ and keeps transistor 30 turned off through discharge transistor 34 that is turned on. If fuse 60 was blown, node 36 is grounded, thereby turning on transmission transistor 32. As a result, the control electrode of transistor 30 is connected to cell input 14.

FOURTH EXAMPLE

Figure 5:
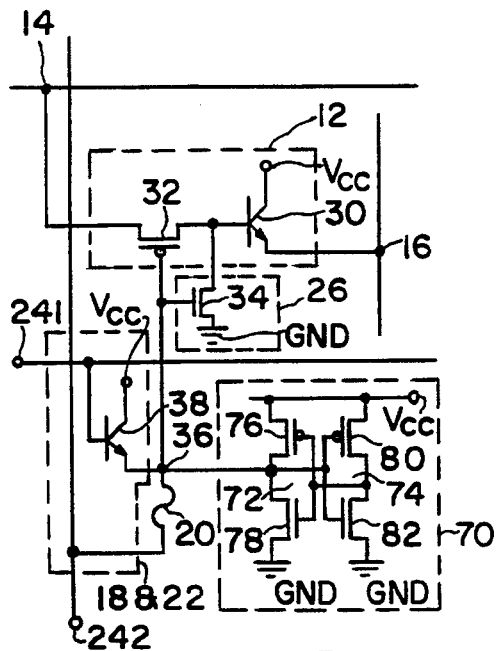

FIG. 5 shows a fourth example of a cell in accord with the invention. With regard to FIG. 2, a biasing circuit 70 is introduced for keeping node 36 at an appropriate voltage dependent on the state of fuse 20. Biasing circuit 70 consumes substantially no power in the read mode. Biasing circuit 70 consists of a bistable element with two cross-coupled inverters 72 and 74. Inverter 72 comprises a PFET 76 and an NFET 78, and inverter 74 includes a PFET 80 and an NFET 82. In the program mode, second control input 242 is kept grounded. If fuse 20 is kept intact, inverter 74 receives a low voltage and subsequently supplies a high output voltage to inverter 72. The output of inverter 72 thereupon furnishes a low voltage to node 38 and to the input of inverter 74. The state wherein inverter 72 supplies a low voltage and inverter 74 provides a high voltage is a stable state of circuit 70. This state is latched. If fuse 20 is blown, biasing circuit 70 is set to keep node 38 at a high voltage. Since inverters 72 and 74 in biasing circuit 70 each are constituted by field effect transistors of complementary conductivity type, power consumption of circuit 70 is negligible. In this embodiment, PFET 76 preferably is larger than PFET 80, and NFET 82 preferably is larger than NFET 78 to ensure proper operation.

Preferably, some precautions are taken at power up in order to preset bistable element 70 appropriately. This can be accomplished by using peripheral circuits already present for controlling the power up of the other circuitry. For instance, in a first power-up cycle, control inputs 241 and 242 are brought high. Whether or not fuse 20 is intact, bistable element 70 is forced to adopt the state wherein NFET 82 and PFET 76 are turned on and NFET 78 and PFET 80 are turned off. In a second power-up cycle control inputs 241 and 242 are held low. If fuse 20 was blown, the state obtained in the first cycle is maintained. If fuse 20 was intact, node 36 is discharged and, consequently, bistable element is set into a state wherein NFET 82 and PFET 76 are turned off and NFET 78 and PFET 80 are turned on.

FIFTH EXAMPLE

Figure 6:
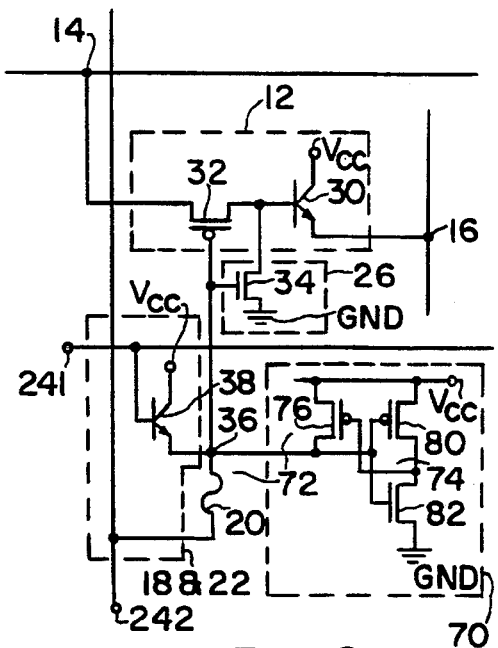

FIG. 6 represents a preferred embodiment for the cell. With regard to FIG. 5, fuse 20 now is combined with transistor 76 to form first inverter 72. First inverter 72 forms a bistable element with second inverter 74.

Programming is accomplished in the way described above. Further operation is, for instance, as follows. In a first power-up cycle node 241 is brought high and node 242 is kept grounded. If fuse 20 is intact, node 36 is grounded, thereby turning PFET 80 on and turning NFET 82 off. As a result, PFET 76 is turned off. If fuse 20 is destroyed, node 36 carries a high voltage. Consequently, PFET 80 is turned off, NFET 82 is turned on and PFET 76 is turned on. Node 241 is grounded in the second power-up cycle. If fuse 20 is intact, node 36 stays grounded and PFET 76 is kept turned off via inverter 74 that supplies a high output voltage. If fuse 20 is destroyed, the voltage at node 36 will stay high since inverter 74 furnishes a low output voltage that keeps PFET 76 turned on. This state is latched for PFET 76 controls inverter 74 and vice versa.

Bipolar transistor 30 in FIGS. 2–6 typically has an emitter area of 1×2 um². This is a considerable reduction in size as compared to the prior art, where the bipolar transistor connected to the fuse has a typical emitter area of 2×10 um².

ARRANGEMENT

Figure 7:
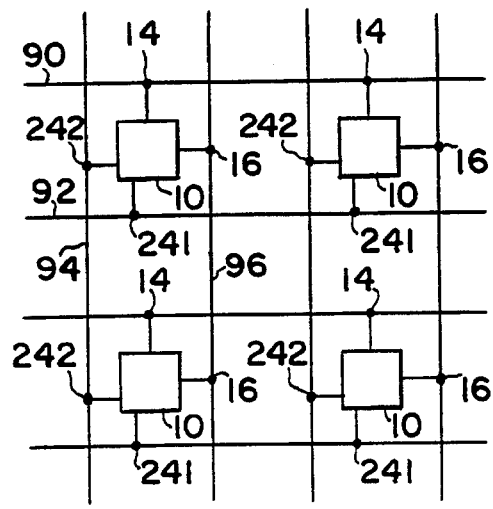
FIG. 7 gives an arrangement of a plurality of cells.

FIG. 7 shows a plurality of cells 10 logically arranged in rows and/or columns. In such an array, cell inputs 14 of cells 10 arranged in a row are connected to a common row input line 90. Similarly, first control inputs 241 of cells 10 located in a same row may be connected to a same row decode line 92. Cells 10 that are arranged in the same column, second control inputs 242, third control inputs 243 (not shown) and outputs 16 may be connected to a same column decode line 94, an additional column decode line (not shown) and a bitline (wired-OR) 96, respectively.

INTEGRATED CIRCUIT

Figure 8:
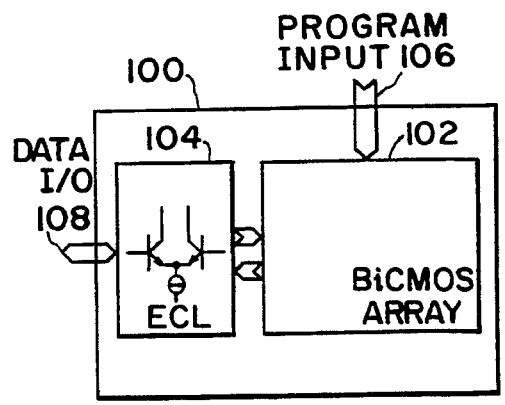
FIG. 8 represents schematically an integrated circuit in the invention.

FIG. 8 schematically represents an integrated circuit 100 with an array 102, such as is partially shown in FIG. 7, I/O circuitry 104, program input 106 and data port 108. In a preferred embodiment of the invention I/O circuitry 104 comprises ECL-type circuits. Array 102 is a BiCMOS-type device.

Computer simulations on such an array 102 embedded in ECL peripheral circuitry 104 indicate a four times higher speed through the array and a three times higher overall speed through the chip with regard to prior art arrays wherein the fuse is included in the signal path. Prior art performance typically is 1 nsec propagation delay for the ECL I/O circuitry and 3.5 nsec for the array. In the invention, the propagation delay for the ECL I/O circuitry 104 has a typical value also of 1 nsec, whereas the array delay is reduced to 0.9 nsec. This gain in operating speed is attainable only at the expense of a 20% increase in substrate area.

Note that in the cells of FIGS. 2, 4–6, transistors 30 and 38 may be replaced by, for instance, a diode in series with fuse 20 between control inputs 241 and 242. NFET 34 may be replaced by, for instance, a resistor between the control electrode of transistor 30 and ground.

We claim:

1. An electronic circuit having an input and an output, said circuit comprising:
   a programmable cell interposed between the input and the output, said cell including a connection that is electrically programmable through a programmable component, the programmable component being located outside the connection, said cell comprising control means for providing a control signal in response to a user-programmable signal that is indicative of a states of component, the connection including transmission means for, under control of the control signal, connecting the input to the output, and the cell comprising discharge means for, under control of the control signal, discharging the output.

2. A circuit as in claim 1 wherein the transmission means comprises a main current path of a transistor that has a control electrode connected to the control means for receiving the control signal.

3. A circuit as in claim 1 wherein the discharge means includes a discharge transistor with a main current path between the connection and a reference voltage and with a control electrode connected to the control means for receiving the control signal.

4. A circuit as in claim 1 wherein the transmission means comprises a main current path of transmission transistor that has a control electrode connected to the control means and wherein the discharge means includes a discharge transistor with a main current path between the connection and a reference voltage and with a control electrode connected to the control means, the transistors being mutually complementarily controllable by the control signal.

5. A circuit as in claim 1 wherein the control means comprises programming means for programming the programmable component.

6. A circuit as in claim 5 wherein the programming means includes a current source that supplies a programming current to the programmable component and that is controllable via a first program input, and wherein the programmable component is connected to a second program input, an intermediate node between the current source and the programmable component being coupled to the transmission means.

7. A circuit as in claim 6 wherein the current source includes a supply transistor having a main current path between a reference voltage and the component and having a control electrode connected to the first program input.

8. A circuit as in claim 6 wherein the intermediate node is coupled to a reference voltage through a resistive element.

9. A circuit as in claim 6 wherein the cell further comprises a bistable element that includes first and second inverters, each with first and second mutually complementarily controllable field effect transistors having main current paths arranged in series between first and second reference voltages and having control electrodes connected to one another and to an output node between the main current paths of the transistors in the other pair, the first inverter having its output node coupled to the intermediate node.

10. A circuit as in claim 9 wherein the first transistors are of the p-channel type (PFETs) and the second transistors are of the n-channel type (NFETs), the PFET in the first inverter being larger than the PFET in the second inverter, and the NFET in the first inverter being smaller than the NFET in the second inverter.

11. A circuit as in claim 6 wherein the cell comprises a bistable element that includes, between first and second reference voltages, a series arrangement of current paths of first and second mutually complementarily controllable field effect transistors having control electrodes connected to one another and to the intermediate node, and that further includes a third field effect transistor that has a main current path coupled between the first reference voltage and the intermediate node and that has a control electrode connected between the main current paths of the first and second transistors.

12. A circuit as in claim 6 wherein a second programmable component is connected between the intermediate node and a third program input, the second and third program inputs being coupled to first and second reference voltages, respectively, via a first and second resistive elements, respectively.

13. A circuit as in claim 6 with at least one further cell that is configured substantially the same as the first-mentioned cell, the cells having their respective cell inputs connected to a row input line and having their respective first program inputs connected to a row decode line.

14. A circuit as in claim 6 with at least one further cell that is configured substantially the same as the first-mentioned cell, the cells having their respective outputs connected to a bitline and having their respective second program inputs connected to a column decode line.

15. A circuit as in claim 13 implemented in monolithic integrated circuit form.

16. A circuit as in claim 14 implemented in monolithic integrated circuit form.

17. A circuit as in claim 6 with at least second and third cells that are configured substantially the same as the first-mentioned cell, wherein the first and second cells have their respective cell inputs connected to a row input line and have their respective first program inputs connected to a row decode line, wherein the first and third cells have their respective outputs connected to a bitline and have their respective second program inputs connected to a column decode line, and wherein the integrated circuit includes ECL-type peripheral circuitry for communicating with the cells.

18. A circuit as in claim 1 wherein the programmable component comprises a fuse.

19. A circuit as in claim 1 wherein the discharge means includes a resistive element between the connection and a reference voltage.

20. A circuit as in claim 4 wherein the current source includes a supply diode between the first program input and the programmable component.

21. A circuit as in claim 1, wherein the programmable component comprises an anti-fuse.

22. A circuit as in claim 1, wherein the programmable component comprises a transistor with a programmable threshold.

* * * * *